(12) United States Patent
Borowsky et al.

(10) Patent No.: US 8,708,164 B2
(45) Date of Patent: Apr. 29, 2014

(54) INTERNAL SEALS FOR SERVER RACKS

(75) Inventors: Erez Borowsky, Albuquerque, NM (US); James R. Fink, Exeter, RI (US)

(73) Assignee: Upsite Technologies, Inc., Albuquerque, NM (US)

( * ) Notice: Subject to any disclaimer, the term of this patent is extended or adjusted under 35 U.S.C. 154(b) by 201 days.

(21) Appl. No.: 13/312,669

(22) Filed: Dec. 6, 2011

(65) Prior Publication Data
US 2013/0140251 A1 Jun. 6, 2013

(51) Int. Cl.
*A47F 7/00* (2006.01)

(52) U.S. Cl.
USPC .............................. 211/26; 277/637

(58) Field of Classification Search
USPC .............. 211/26; 277/637, 630, 636
See application file for complete search history.

(56) References Cited

U.S. PATENT DOCUMENTS

| | | | | |
|---|---|---|---|---|
| 4,441,726 A | * | 4/1984 | Uhl | 277/637 |
| 4,492,817 A | * | 1/1985 | Selby | 277/637 |
| 4,730,832 A | * | 3/1988 | Cederwall et al. | 277/637 |
| 7,556,220 B2 | * | 7/2009 | Schulz | 277/637 |
| 7,594,792 B2 | * | 9/2009 | Audeon et al. | 277/637 |
| 7,604,535 B2 | | 10/2009 | Germagian et al. | |
| 2006/0081545 A1 | * | 4/2006 | Rassmussen et al. | 211/26 |
| 2009/0178985 A1 | * | 7/2009 | Sempliner et al. | 211/26 |
| 2012/0273438 A1 | * | 11/2012 | Nordin et al. | 211/26 |
| 2012/0306166 A1 | * | 12/2012 | Melton et al. | 277/637 |
| 2013/0037655 A1 | * | 2/2013 | Bradley et al. | 277/637 |
| 2013/0161273 A1 | * | 6/2013 | Borowsky et al. | 211/26 |

OTHER PUBLICATIONS

Chatsworth Products Inc (CPI); CPI's Ducted Exhaust Cabinet; Undated; p. 7.
Write Line—Technical Environment Solutions; "Paramount Enclosure System"; Write Line LLC 2006; pp. 1-16.

* cited by examiner

*Primary Examiner* — Jose V Chen
(74) *Attorney, Agent, or Firm* — St. Onge Steward Johnston & Reens, LLC

(57) ABSTRACT

An air sealing device for installation in server racks to minimize the internal mixing of cooling air with warm air without passing through a server. The device has an elongated support strip of ABS or similar plastic material, to one portion of one side of which is secured a double side foam mounting strip, with an outside adhesive surface covered by a removable strip. A Neoprene foam, resiliently flexible sealing strip is adhesively secured by one edge margin thereof to the available surface portion of the support strip, on the same side as the mounting strip. The sealing strip can be mounted on a rack element to extend across an air space and into contact with a cover panel to prevent bypass air flow along sides of the rack. The device can also be mounted on a frame element to extend over surface areas thereof to close openings therein.

20 Claims, 5 Drawing Sheets

INTERNAL SEALS FOR SERVER RACKS

The present invention relates to air flow control devices for increasing efficiencies in the supply of cooling air in data centers and the like housing a plurality of racks of servers. More particularly, the invention is directed to a simple, relatively inexpensive, easily installed and highly effective sealing device for minimizing the bypass flow of cooling air in such environments.

BACKGROUND OF THE INVENTION

Modern data centers house large numbers of computer servers, typically in frame racks, in which a plurality of servers are mounted in a closely spaced relation. In operation the densely arranged servers generate substantial heat, which must be removed in order to prevent overheating and malfunction of the equipment. The individual server units generally are provided with internal fans, which pull cooling air through the unit. However, because of the high density of the equipment, it is customary to provide substantial air conditioning systems to supply cooled air to the fronts of the racks, available to be drawn through the individual servers by their internal fans.

Operating efficiency of the cooling systems has become an increasing problem as the power output of the servers has been progressively increased and the expense of cooling them has become very meaningful. A significant aspect of controlling cooling costs is the prevention or minimization of mixing of the supplied cool air with warm air in the data center, without the cool air having been passed through a server and absorbed its heat. Where mixing is allowed to occur outside of the servers, the capacity of the A/C equipment must be enlarged, at increased capital expense up front, and the efficiency of the A/C equipment is compromised by the lower temperature differential between the air supplied to and delivered by the A/C equipment.

Among the techniques employed at modern data centers are hot-air-cold air aisles, hot air containment and cold air containment. For the hot-air-cold air aisles, servers are arranged side-by-side in rows. Two rows of servers are oriented back to back, with cool air being supplied to the fronts of the rows (cold aisles) and warm air being collected in the hot aisle between the two rows and returned to the A/C unit. This technique represents an improvement over previous arrangements but still permits considerable quantities of the cool air to bypass the servers and mix with warm air.

The hot air containment procedure is similar to the above but involves completely closing off the hot aisle at the top and ends, to further reduce the amount of cool air permitted to return without passing through a server, while allowing the cool air to be present generally throughout the room. Warm air from the enclosed hot aisle is ducted back to the A/C unit and a relatively high efficiency is achieved. In some cases warm air is ducted out of the backs of each of the server cabinets and returned to the A/C unit. Cold air containment is similar to the hot air containment procedure, except that the cold air is contained in an aisle space and warm air is present throughout the room. This procedure is not as widely used as hot air containment because the presence of the warm air generally throughout the room makes for an uncomfortable working environment.

Even in relatively efficient systems, such as hot air containment, there still can be significant efficiency losses. For example, in some cases the server racks may be constructed with interconnected internal and external frames. The internal frames serve to mount a plurality of servers and blanking panels and the external frames mount cover panels or doors. This arrangement, which may be referred to herein as a double frame rack, enables initial wiring of the servers to take place in an open environment, before the cover panels and doors are installed. The double frame construction, which useful for certain purposes, results in a space being formed between the servers, mounted on the internal frame elements, and cover panels, mounted on external frame elements, through which cooling air can flow to the warm side of the rack without passing internally through a server. In early installations this may not have resulted in a significant loss of efficiency, because the servers have their own internal fans intended to draw the available cool air through the servers.

Modern data room configurations, however, such as the hot air and cold air containment configurations referred to above, can result in considerable air pressure differentials between the cold and hot sides of the servers, such that there can be a meaningful bypass flow of cooling air around the servers, in the space between internal and external frame structures, notwithstanding the normal functioning of the internal server fans. Such bypass flow, and the resulting losses in operating efficiencies, have become an increasing issue as the power of the servers has been increased and along with that the power of the A/C systems and the increased pressure differentials utilized therein. There has been a definite need for sealing devices that can be quickly and easily attached to frame elements of a server rack, to seal off spaces internal and external frames of the rack and prevent the flow of bypass air at the sides of the servers and also at the bottom of the rack.

SUMMARY OF THE INVENTION

The invention relates to an elegantly simple and inexpensive form of sealing device that can be quickly and easily installed within a double frame rack to effectively close off the spaces otherwise formed between the servers and blanking panels, mounted on the internal frame structure, and the cover panels, mounted on the external frame structure. The device of the invention is in a strip form and is comprised of three strip elements combined to form a simplified yet highly effective sealing means for use in the indicated environment. The three elements include an support strip formed of a relatively rigid plastic material, such as ABS. A double-sided foam tape is adhesively bonded to one side of the support strip. The foam tape, in itself of known construction, has a removable cover strip on an adhesively coated outer surface. The tape covers a portion of the surface of the support strip. The remaining surface portion adhesively mounts an edge margin of a sealing strip, which is formed of a resiliently flexible foam plastic material. The sealing strip has a portion projecting away from the support strip which, when the strip is installed, engages an opposed surface to close off an air space. The sealing device can be installed in seconds, such that data center operators are encouraged to utilize them and realize the significant benefits resulting therefrom. The sealing devices are also useful in closing off air passages formed in the bottom structure of a rack, such that warmed air from within the rack does not escape to mix with the cooling air.

For a more complete understanding of the above and other features and advantages of the invention, reference should be made to the following detailed description of preferred embodiments of the invention and to the accompanying drawings.

DETAILED DESCRIPTION OF THE INVENTION

Figure 1:
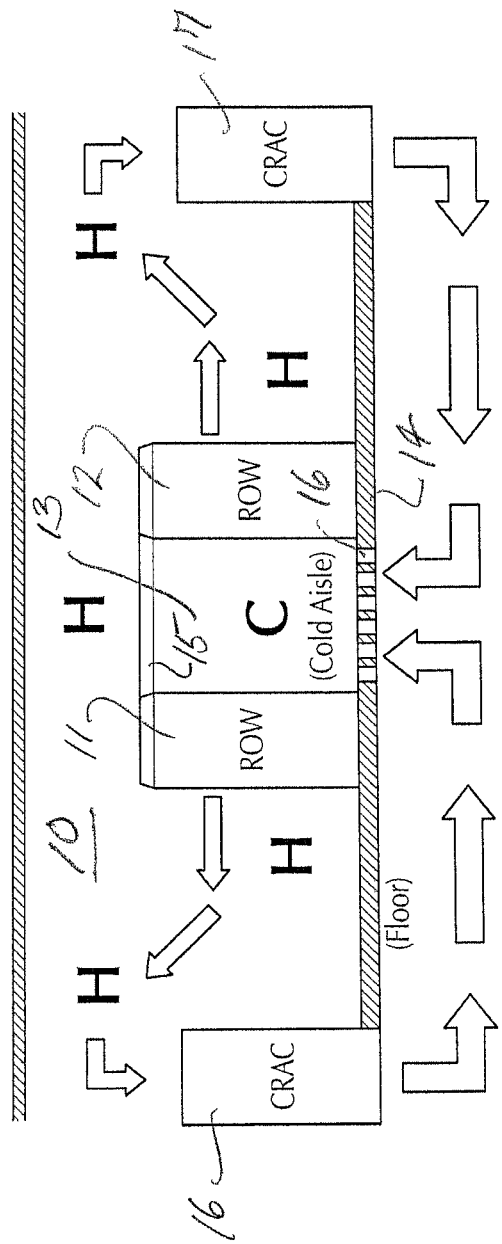
FIG. 1 simplified representation of a cold air containment system for cooling servers in a data center.

Referring now to the drawings, the reference numeral 10 (FIG. 1) designates a form of computer room of a typical data center. The room is set up with two rows of server racks or cabinets 11, 12 placed in tight side-by-side arrangement. For simplification, the terms cabinet or rack will be used interchangeably herein and in the claims to refer to either form of structure.

The fronts of the racks face toward a confined cold aisle 13, which is enclosed on the sides by the computer rows, on the bottom by a floor 14 and at the top by a cover 15. Cooled air is delivered to the cold aisle 13 by computer room air conditioners (CRAG) 16, 17 at each side, directing cooled air under the floor and into the cold aisle via floor openings 15.

In a typical data center large numbers of individual servers (not shown) are stacked in the racks 11, 12 and are provided with their own internal fans to draw in the cooled air from the aisle 13 and discharge the air, with added heat, from the backs of the racks 11, 12 into the room 10, to be circulated back to the air conditioners 16, 17.

A cold air confinement system, illustrated in FIG. 1, is similar in several ways with the hot aisle-cold aisle system except that, in the latter, the confinement cover 15 is not provided over the cold aisle(s), such that there can be mixing of warm and cooled air over the tops of the server cabinets. Accordingly, the cold air containment system can make more efficient use of the cooling capacity of the A/C equipment than the hot aisle-cold aisle system.

Figure 2:
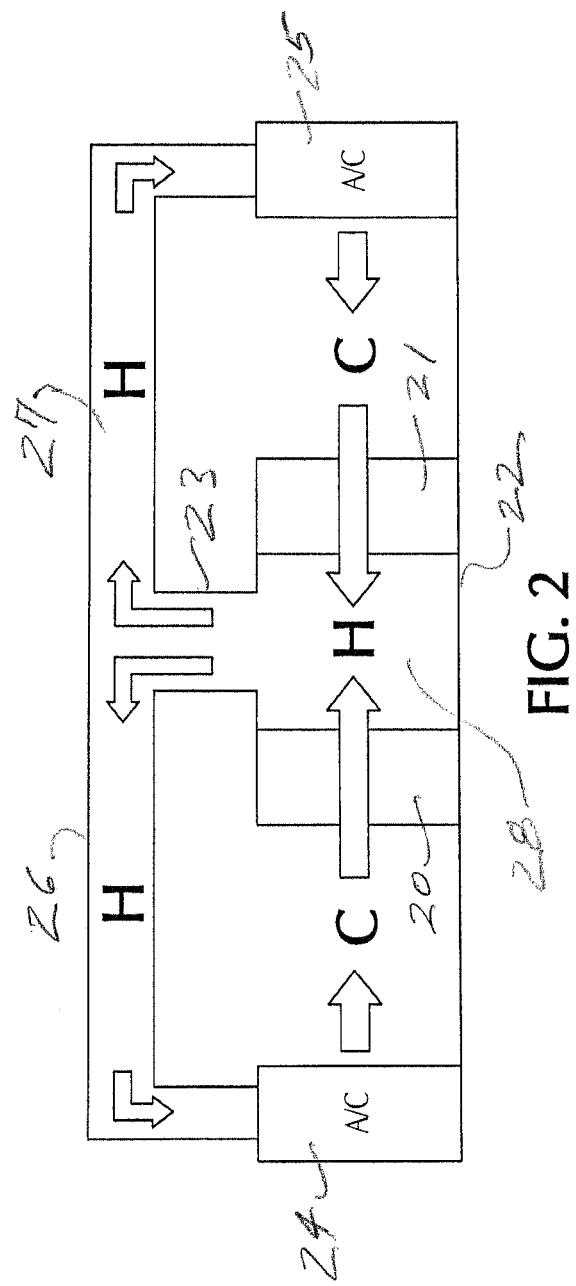
FIG. 2 a simplified representation of a hot air containment system used in a data center.

FIG. 2 illustrates a hot air containment system in which rows 20, 21 of server racks are oriented back-to-back defining, along with a floor 22 and outlet duct 23, a confined space for the warm discharged from the backs of the racks. The warm air is conveyed back to air conditioning units 24, 25 through ceiling ducts 26, 27. The hot air containment system of FIG. 2 is similar in efficiency with the cold air containment system of FIG. 1, although the hot air containment system offers a more comfortable working environment. In some cases, warm air is collected and ducted away from the individual racks instead of being collected in a hot aisle space 28 behind the cabinets.

Figure 3:
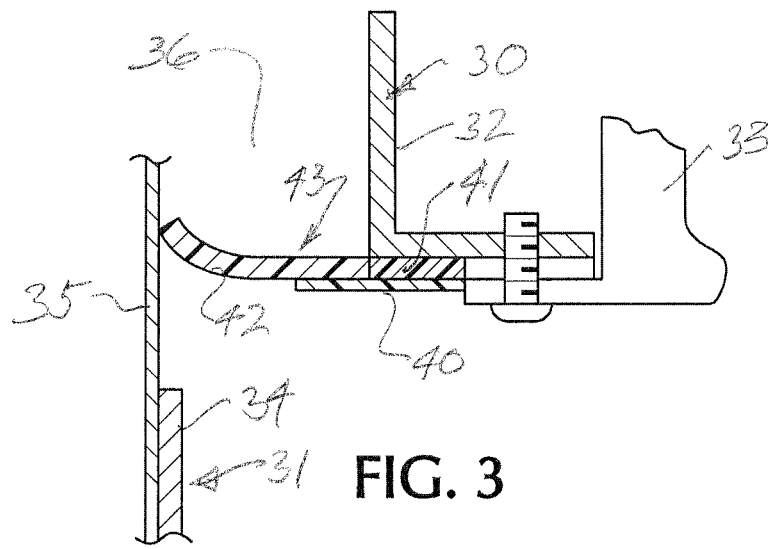
FIG. 3 is a fragmentary cross sectional view showing vertical frame elements of a double frame rack, with a sealing device according to the invention installed to close an air space within the rack.
Figure 4:
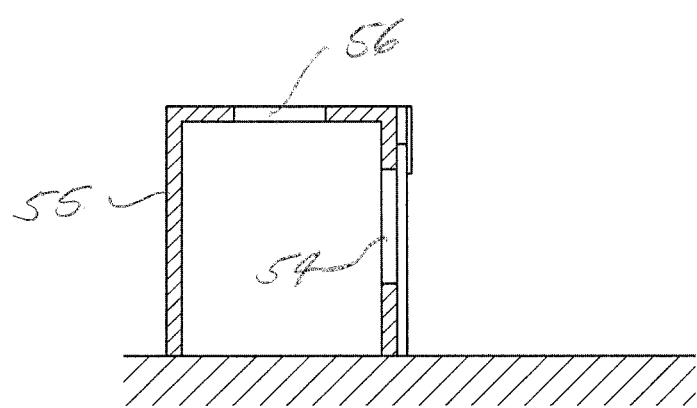
FIG. 4 is a cross sectional view of a bottom frame element of the rack of FIG. 3, with a sealing device according to the invention installed on an inside surface thereof to prevent the flow of warm air through openings in the frame element.

In certain forms of server racks, such the Paramount enclosure system sold by Wright Line LLC (now part of Eaton Corporation), a double frame structure is employed, which comprises an internal frame structure indicated in part by the reference numeral 30 in FIG. 3, and an external frame structure, indicated in part by the reference numeral 31. The internal frame structure 30, which includes a vertically disposed right-angle frame member 32, mounts a plurality of servers 33. In a typical installation, blanking plates (not shown) are mounted on the internal frame structure 30 in order to close off any spaces between vertically adjacent servers 33. The function of the blanking plates is to prevent cooling air, supplied at the front of the rack, from flowing through the rack between servers and mixing with warm air at the back of the rack without having passed through and extracting heat from a server.

The external frame structure 31, including a vertical frame member 34, mounts an external cover panel or divider panel 35 in order to close the sides of the rack. It will be noted, however, that a space 36 exists between the outside of the internal frame 30 and in cover panel 35, through which air can bypass the servers.

The individual servers 33 have their own internal fans, the function of which is to draw cool air, provided at the front of the server, through the interior of the server to cool its critical components, and to discharge the warmed air at the back of the server. However, in many data center set ups, external pressure differentials may exist between the fronts and backs of the server racks, which can cause the flow of air through any open spaces provided at the sides of the servers and above or below the servers. In such cases a significant flow of bypass air can take place in the side spaces 36 of the server rack. The present invention provides a simplified, inexpensive and easily installed sealing device for, among other things, sealing the side space 36 of a double frame rack, such as the Paramount enclosure system. For convenience, a copy of a Wright Line brochure, illustrating the Paramount enclosure system, has been submitted with the filing of this application in order to make it available to those having an interest.

Figure 5:
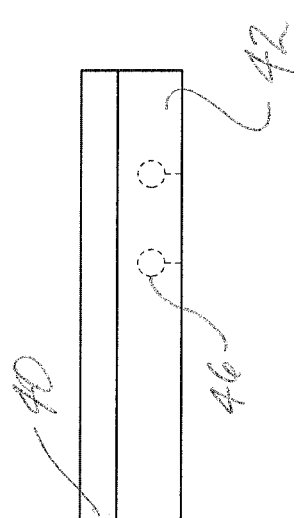
FIGS. 5 and 6 are front elevation and end elevation views, respectively, of one representative form of the sealing device of the invention.
Figure 6:

A first embodiment of the invention, shown in FIGS. 5 and 6, is comprised of three parts 40-42, joined to make a unique and efficient sealing device 43. The illustrated device 43 includes an elongated support strip 40, formed of a suitable plastic material such as ABS. Although specific dimensions are not a feature of the invention, a suitable size for use in a side seal for the space 36 is 0.88 inch in width and 0.063 inch in thickness. Length can be easily customized and/or field cut to suit. However, a suitable length for the Paramount enclosure system is 39.25 inches. A mounting strip 41, in the form of a double-sided polyurethane foam tape, is mounted on a portion of one surface of the support strip 40 by one of its adhesively coated surfaces. The mounting strip 41 of the same length as, but of less width than the support strip 40, as shown particularly in FIG. 6. A suitable width for the mounting strip 41 is 0.5 inch, and it desirably is mounted at one edge of the support strip 40 so as to leave an open surface margin 44 of about 0.38 inch in width. Attached to the surface margin 44 is an edge margin 45 of a flexible sealing strip 42, preferably formed of a flame-resistant neoprene foam rubber material and having a length equal to that of the support strip 40. A sealing strip 42, suitable for the described frame structure, may have a width of 1.88 inches. A marginal width (edge margin) 45 of 0.38 inch of the sealing strip is adhesively bonded to the surface 44 of the support strip 40, closely adjacent to the mounting strip 41. Preferably, the mounting strip 41 and sealing strip 42 have the same or closely similar thicknesses, which suitably may be 0.125 inch.

With reference again to FIG. 3, the sealing device 43 can be easily and expeditiously installed in a double frame rack by removing the cover strip (not shown) from the outer adhesive surface of the mounting strip 41 and securing that surface to an exposed, front-facing surface portion of the structural element 32 of the internal frame 30. The installation requires only that the mounting strip be aligned vertically at the front of the frame element 32, after which finger pressure along the surface of the support strip 40 causes the mounting strip 41, and thus the entire device 43, to be securely mounted to the frame element 32. The pre-calculated width of the flexible foam sealing element 42 is such that, in the absence of the cover panel 35, the outer portions of the sealing element 42 extend beyond the external frame element 34. Typically and preferably, installation of the sealing device 43 precedes attachment of the cover panel 35, and the sealing strip 42 is deflected into snug contact with panel 35 during its attachment. When necessary, the sealing device 43 can be easily installed after the panel 35 is in place, by causing the sealing strip 41 to be deflected during securing of the mounting strip to the internal frame element 32.

The specifically described sealing element 43 is of a length such that two such sealing elements, one above the other, can seal one side of a Paramount enclosure. Accordingly, with the described sealing device, both sides of a Paramount enclosure can be quickly sealed by installing two of the sealing devices 43 on each side. This can be accomplished by a skilled work person in a matter of seconds, and can result is very significant efficiencies in air conditioning operations at the data center, which makes installation of the sealing devices a compelling option to the operators of the data center.

In some cases, it may be necessary or desirable to run wires in the side space 36 being closed by the sealing strips 42. To accommodate such circumstances, the sealing strips 42 advantageously are pre-scored with keyhole shaped scoring, indicated at 46 in FIG. 5. The scoring 46, which may be repeated at a number of spaced locations along the length of the sealing strip, consists of a circular score 47 formed in the body of the sealing strip and connected to the edge of the edge of the strip by a linear score 48. To accommodate a cable, the foam material bounded by a circular score 47 is punched out of the sealing strip, and the linear score 48 is separated to provide cable access to the circular cut out.

Figure 8:
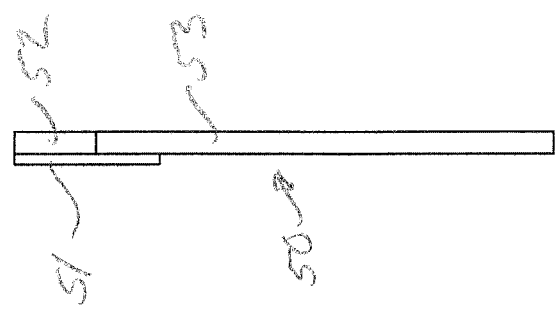
FIGS. 7 and 8 are front elevation and end elevation views, respectively, of a second representative form of the sealing device of the invention.
Figure 7:
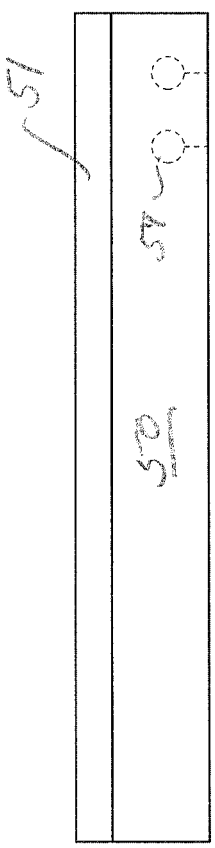

FIGS. 7 and 8 illustrate a second embodiment of the invention, which is of substantially the same construction as the embodiment of FIGS. 5 and 6, except the sealing device 50 shown in FIGS. 7 and 8 has a shorter length and a somewhat wider sealing strip. The basic components of support strip 51, mounting strip 52 and sealing strip 53 are of the same materials as for the device of FIGS. 5 and 6 and are assembled in the same manner. The sealing device 50 is intended for sealing openings 54 which are present on an inside wall of a bottom frame element 55 of the rack structure. These bottom frame elements 55 typically are present at the front and back of the rack structure and also have openings 56 in upper walls thereof. The open structure of the frame elements, particularly at the front of the rack, provides a passage for warm air from within the rack structure to escape to the front thereof and mix with cool air.

The sealing device 50 has a length and width appropriate for the length and height of the frame element 55. As in the case of the sealing element 43, the item can be field cut to a suitable length or pre-formed to a length of 20.25 inches for the indicated Paramount enclosure. The sealing strip 53 advantageously has a width of 2.75 inches, leaving a portion of 2.37 inches projecting beyond the lower edge of the support strip 51. The strip is installed by removing the cover strip (not shown) from the mounting strip 52 and pressing its exposed adhesive surface against an upper margin of the inside surface of the bottom frame element 55. The installation takes only seconds and serves to close off all openings in the inside wall of the frame element. A sealing element 50 can also be similarly mounted to an inside wall of a back frame element (not shown) corresponding to the element 55.

The sealing device of FIGS. 7 and 8 can also be provided with keyhole scoring 57, corresponding to that of the first described embodiment, if desired, in order to accommodate the passage of cables, where that is required.

Sealing devices according to the invention can be easily sized for almost any rack frame structure by variations in the width of the Neoprene foam sealing strip and by variations in the length of the device. Moreover, devices of a given width may be furnished in extended lengths and cut to a desired length in the field. Because of the low cost of the device and the ease of its installation, data center operators are incentivized incorporate the sealing devices in their equipment in order to realize the significant efficiencies and cost savings. The cost savings are realized not only from lower running expenses but also with respect to lower capacity requirements for the air conditioning equipment, resulting in lower capital costs.

It should be understood, of course, that the specific preferred embodiments of the invention illustrated and described herein are intended to be representative only, and not by way of limitation, as variations may be made therein without departing from the clear teachings of the invention. Accordingly reference should be made to the following appended claims in determining the full scope of the invention.

What is claimed is:

1. An air seal for a server rack or the like which comprises
a support strip of rigid plastic material having a length, a width and a thickness,
said support strip having first and second surfaces and side edges,
a mounting strip of foam tape having first and second surfaces and having a width substantially less than the width of said support strip,
said mounting strip having the first surface thereof adhesively secured to the first surface of said support strip along a portion of the first surface of said support strip at one side thereof,
said mounting strip having an adhesive coating on the second surface thereof covered by a removable strip,
a resiliently flexible sealing strip having a length corresponding to the length of said support strip and having a width and first and second surfaces and side edges,
a first portion of said sealing strip, extending along one side thereof, being adhesively secured to said first surface of said support strip closely adjacent to said mounting strip,
the width of said sealing strip being such that a second portion of said sealing strip extends laterally beyond said support strip.

2. An air seal according to claim 1, wherein
said mounting strip and said sealing strip are of closely similar thicknesses, whereby said mounting and sealing strips may overlie portions of the same surface when said air seal is installed.

3. An air seal according to claim 1, wherein
said mounting strip is formed of a polyurethane foam material and said sealing strip is formed of a Neoprene foam rubber.

4. An air seal according to claim 1, wherein
said mounting strip has a width which is more than 50% of the width of said support strip, and
said sealing strip is adhesively bonded to a portion of the first surface of said support strip which is less than 50% of the width of said support strip.

5. An air seal according to claim 4, wherein
said support strip has a width of approximately 0.88 inches,
said mounting strip has a width of approximately 0.50 inches, and
said sealing strip has a width in excess of 1.8 inches.

6. An air seal according to claim 5, wherein
said sealing strip and said mounting strip have a thickness dimension of approximately 0.125 inch.

7. An air seal according to claim 5, wherein
said support strip is formed of ABS and has a thickness of about 0.063 inch.

8. An air seal according to claim 1, wherein
said sealing strip is formed with score lines in one or more locations and comprised of a first score line of circular shape formed in said strip between a projecting free edge thereof and said support strip and a second score line extending from said circular shape to said projecting free edge.

9. An air seal according to claim 1, wherein the length of said sealing strip is the same as the length of said support strip.

10. An air seal according to claim 1, wherein the first portion of said sealing strip abuts said mounting strip.

11. An air seal according to claim 10, wherein the length of said sealing strip is the same as the length of said support strip.

12. An air seal according to claim 11, wherein the thickness of said mounting strip is the same as the thickness of said sealing strip.

13. An air seal according to claim 1, wherein the thickness of said mounting strip is the same as the thickness of said sealing strip.

14. The combination of a server rack and an internal air seal for said rack, which comprises
an inner frame structure for mounting of a plurality of servers and an external frame,
said internal and external frames being separated a distance defining an air space,
said air seal comprising an elongated strip-like support member formed of a rigid plastic material and having a length, a width and a thickness,
said strip-like support member having first and second surfaces and side edges,
a mounting strip formed of a plastic foam material and having a length corresponding to the length of said support member and a width less than the width of said support member and having a first surface adhesively bonded to a first portion of the first surface of said support member at one side thereof,
a second surface of said mounting strip having an adhesive coating thereon,
a sealing strip of resiliently flexible plastic foam material having a length corresponding to the length of said support member and a width substantially greater than a second portion of the first surface of said support member not covered by said mounting strip,
an edge portion of said sealing strip being adhesively bonded to said second portion of the first surface of said support member,
a cover panel mounted on said external frame,
said mounting strip being adhesively secured to an element of said internal frame such that said flexible sealing strip extends toward and into contact with said cover panel to form an air block in an air space between said internal frame and said cover panel.

15. The combination of claim 14, wherein
said plastic foam materials of said mounting strip and said sealing strip are of similar thickness, whereby, said adhesively bonded edge portion of said sealing strip can overlie the same surface to which said mounting strip is adhesively secured.

16. The combination of claim 14, wherein
the length of said mounting strip is the same as the length of said support member; and
a thickness of said mounting strip is the same as a thickness of said sealing strip.

17. The combination of a server rack and an internal air seal for said rack, which comprises,
a bottom frame element for said rack, said bottom frame element being of hollow construction and having outer, top and inner walls and having openings in said top and inner walls forming a passage for air to flow outwardly from within said rack through said openings, and
said air seal comprising an elongated strip-like support member formed of a rigid plastic material and having a length, a width and a thickness,
said strip-like support member having first and second surfaces and side edges,
a mounting strip formed of a plastic foam material and having a length corresponding to the length of said support member and a width less than the width of said support member and having a first surface adhesively bonded to a first portion of the first surface of said support member at one side thereof,
a second surface of said mounting strip having an adhesive coating thereon,
a sealing strip of resiliently flexible plastic foam material having a length corresponding to the length of said support member and a width substantially greater than a second portion of said first surface of said support member not covered by said mounting strip,
an edge portion of said sealing strip being adhesively bonded to said second portion of said first surface of said support member,
said mounting strip being adhesively secured to an edge portion of the inner wall of said bottom frame element such that said flexible sealing strip extends toward an opposite edge of said inner wall, and
said sealing strip having a width sufficient to extend over and cover said openings in said inner wall.

18. The combination of claim 17, wherein
said sealing device has a width corresponding to a top-to-bottom height of said inner wall.

19. The combination of claim 17, wherein,
said mounting strip is secured to an upper edge portion of said bottom frame element and extends downward from said upper edge portion to cover the openings in said inner wall.

20. The combination of claim 17, wherein
the length of said mounting strip is the same as the length of the support member; and
the length of the sealing strip is the same as the length of the support member.

* * * * *